Figure 1:
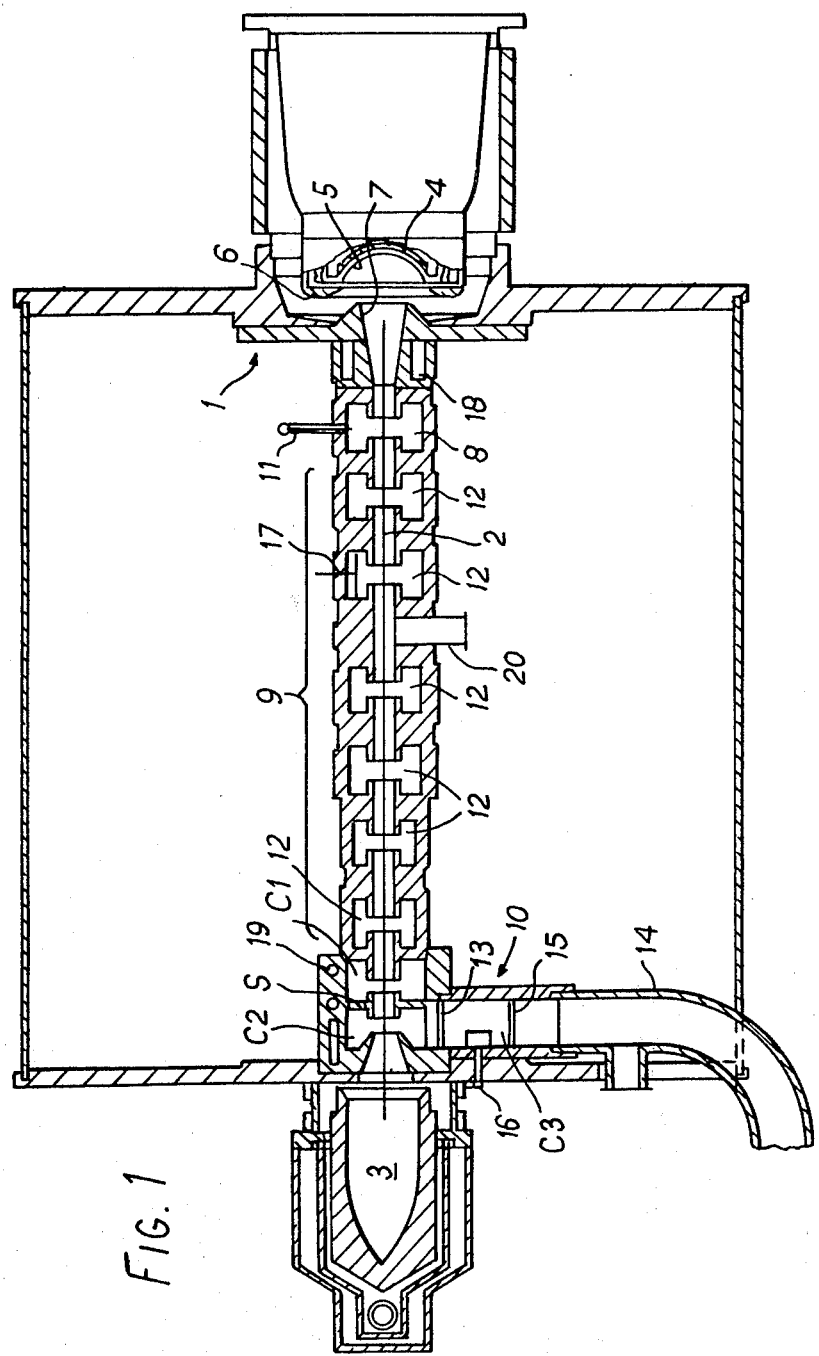

United States Patent [19]

Perring et al.

[11] 4,284,922
[45] Aug. 18, 1981

[54] LINEAR BEAM MICROWAVE AMPLIFIER HAVING SECTION COMPRISING THREE RESONANT COUPLED CIRCUITS TWO OF WHICH ARE RESONANT CAVITIES WHICH INTERACT WITH THE BEAM

[75] Inventors: Dudley Perring, Charvil; Michael J. Smith, Chalfont St. Giles; John P. Randall, Hillingdon, all of England

[73] Assignee: EMI-Varian Limited, Hayes, England

[21] Appl. No.: 72,678

[22] Filed: Sep. 5, 1979

[30] Foreign Application Priority Data

Sep. 6, 1978 [GB] United Kingdom ............... 35769/78

[51] Int. Cl.³ ............................................. H01J 25/10
[52] U.S. Cl. .................................. 315/5.39; 315/5.43;
315/5.53; 315/39.53
[58] Field of Search .................. 315/5.39, 5.43, 5.53,
315/5.41, 39.53

[56] References Cited

U.S. PATENT DOCUMENTS

| | | | |
|---|---|---|---|
| 3,028,519 | 4/1962 | Jepsen et al. | 315/5.43 |
| 3,336,496 | 8/1967 | Blinn | 315/5.53 X |
| 3,447,018 | 5/1969 | Schmidt | 315/5.39 |
| 3,447,019 | 5/1969 | Romiguiere | 315/5.43 |
| 3,453,483 | 7/1969 | Leidigh | 315/5.39 |
| 3,483,420 | 12/1969 | Lien et al. | 315/5.39 |
| 3,622,834 | 11/1971 | Lien | 315/5.39 |
| 3,906,300 | 9/1975 | Tran | 315/5.41 |
| 4,122,373 | 10/1978 | Vaguine | 315/5.41 |

Primary Examiner—Saxfield Chatmon, Jr.
Attorney, Agent, or Firm—Fleit & Jacobson

[57] ABSTRACT

A linear beam tube has an input section, a buffer or buncher section, and an output section.

The buffer or buncher section comprises two circuits in series, each of which (FIG. 5) comprises two resonant cavities C51 and C52 through which the electron beam passes and a third resonant cavity C53 coupled to cavity C51 by a slot 53 and to cavity C52 by a slot 54.

The output section (FIG. 2a) comprises two resonant cavities C1 and C2 through which the beam passes and which are coupled by a slot 5. A third resonant cavity C3 is coupled to cavity C2 by an iris 13, and to an output waveguide 14 by a further iris 15.

The input section may comprise a travelling wavetube section, or the series arrangement of a standard klystron cavity and two buffer sections as shown in FIG. 5.

Slot or iris couplings may be replaced by a loop coupling as known in the art.

The resulting amplifier has an improved bandwidth/efficiency product.

30 Claims, 16 Drawing Figures

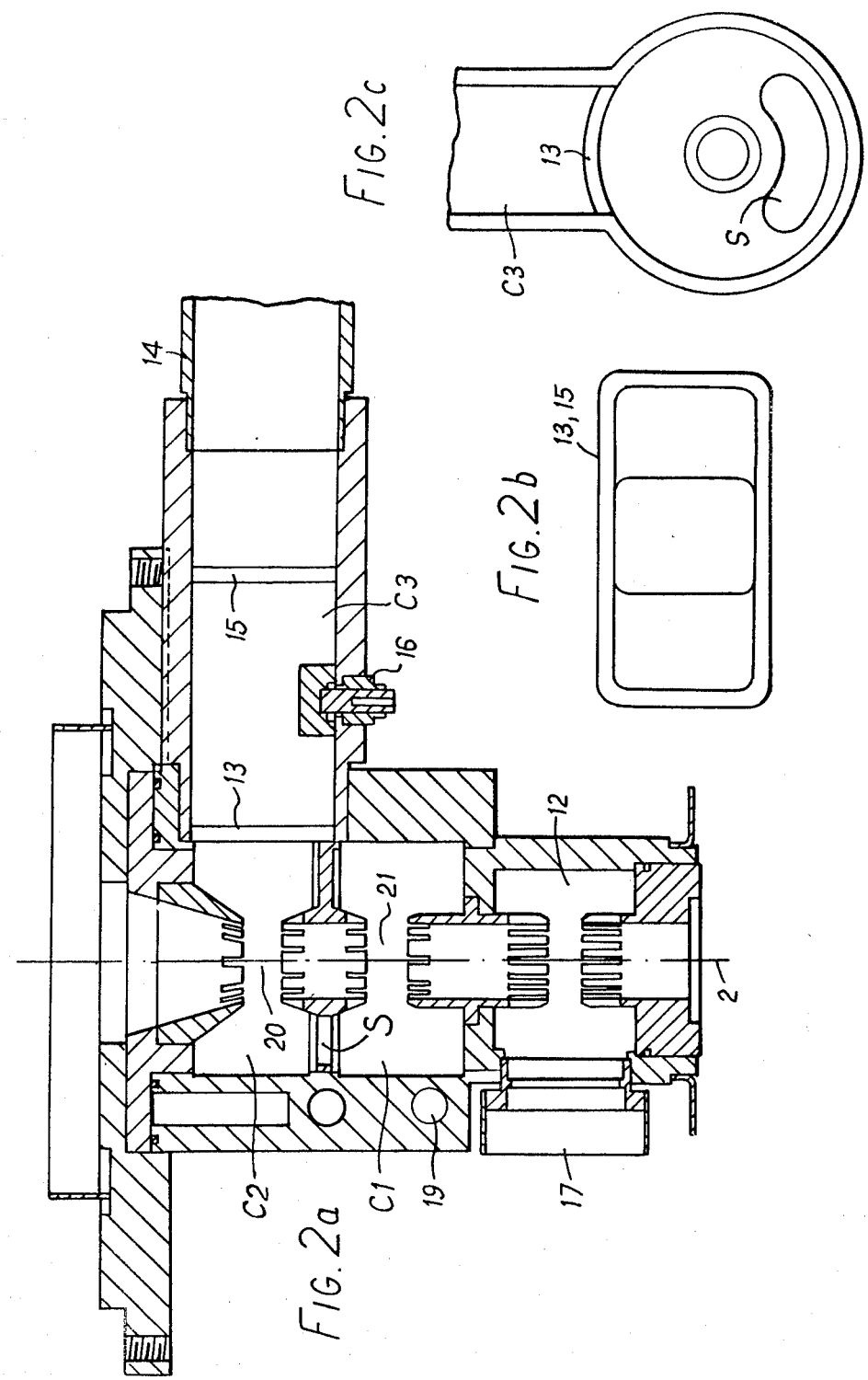

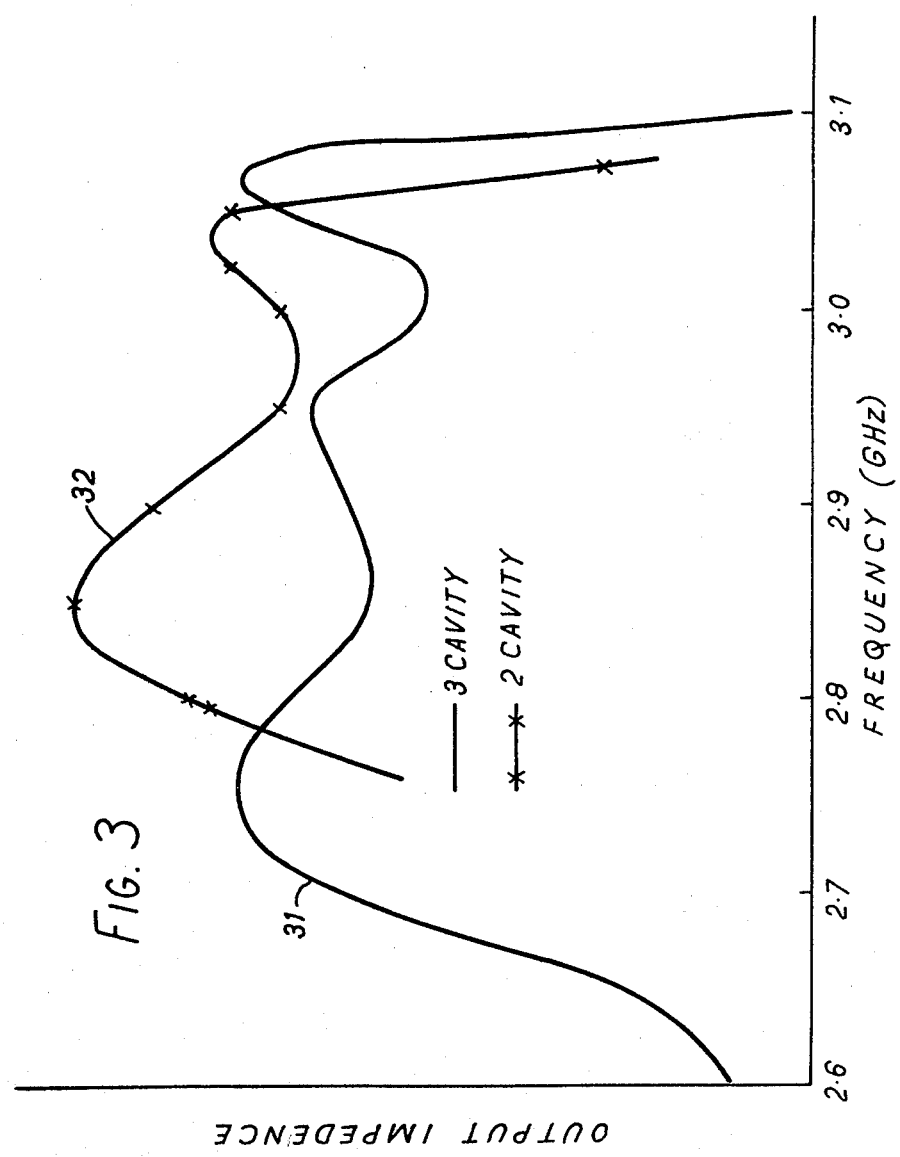

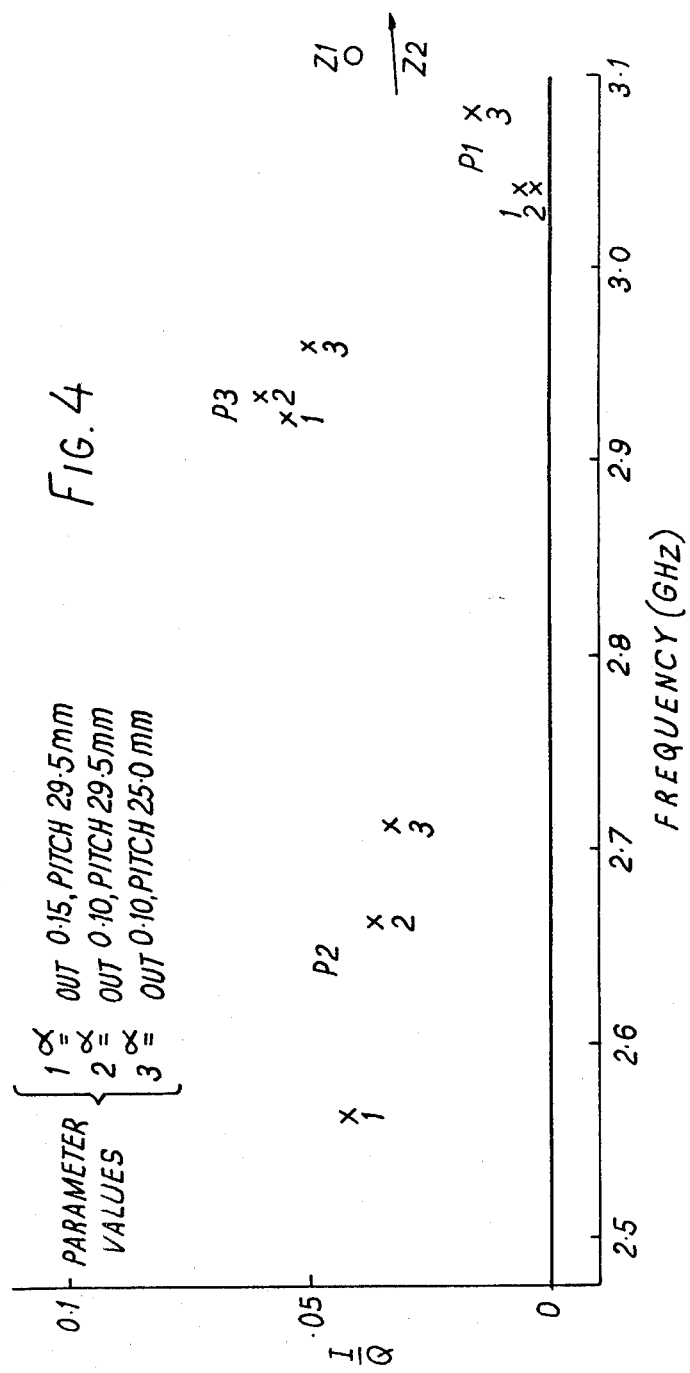

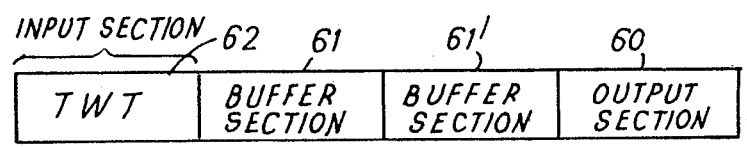
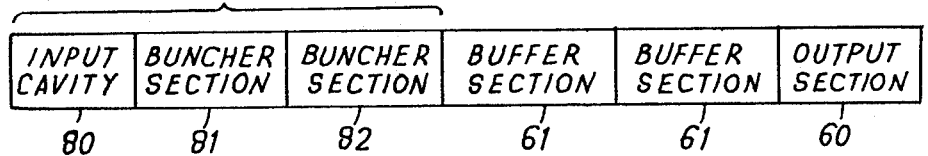
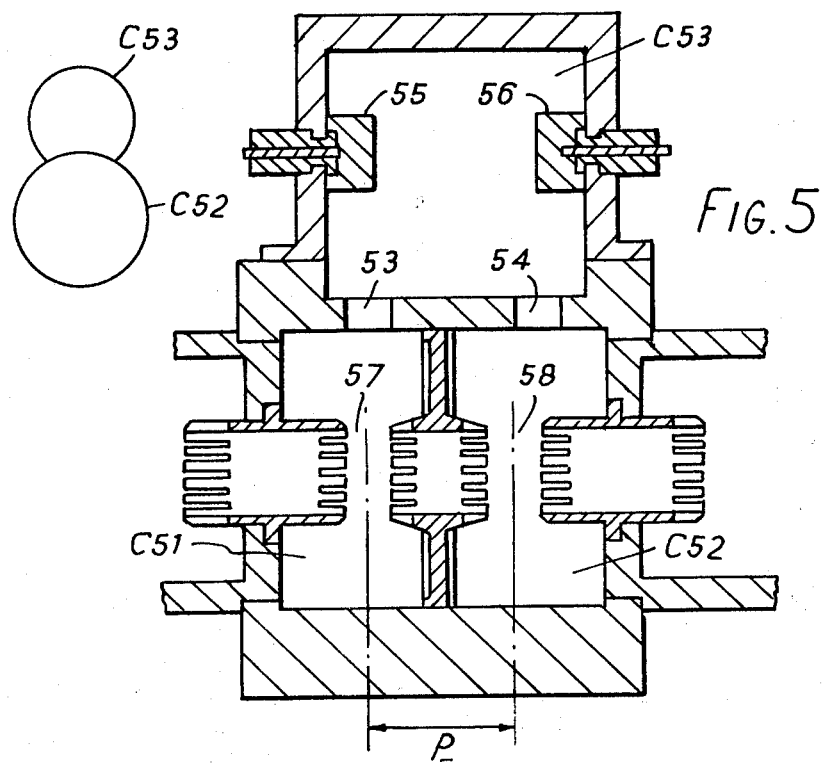

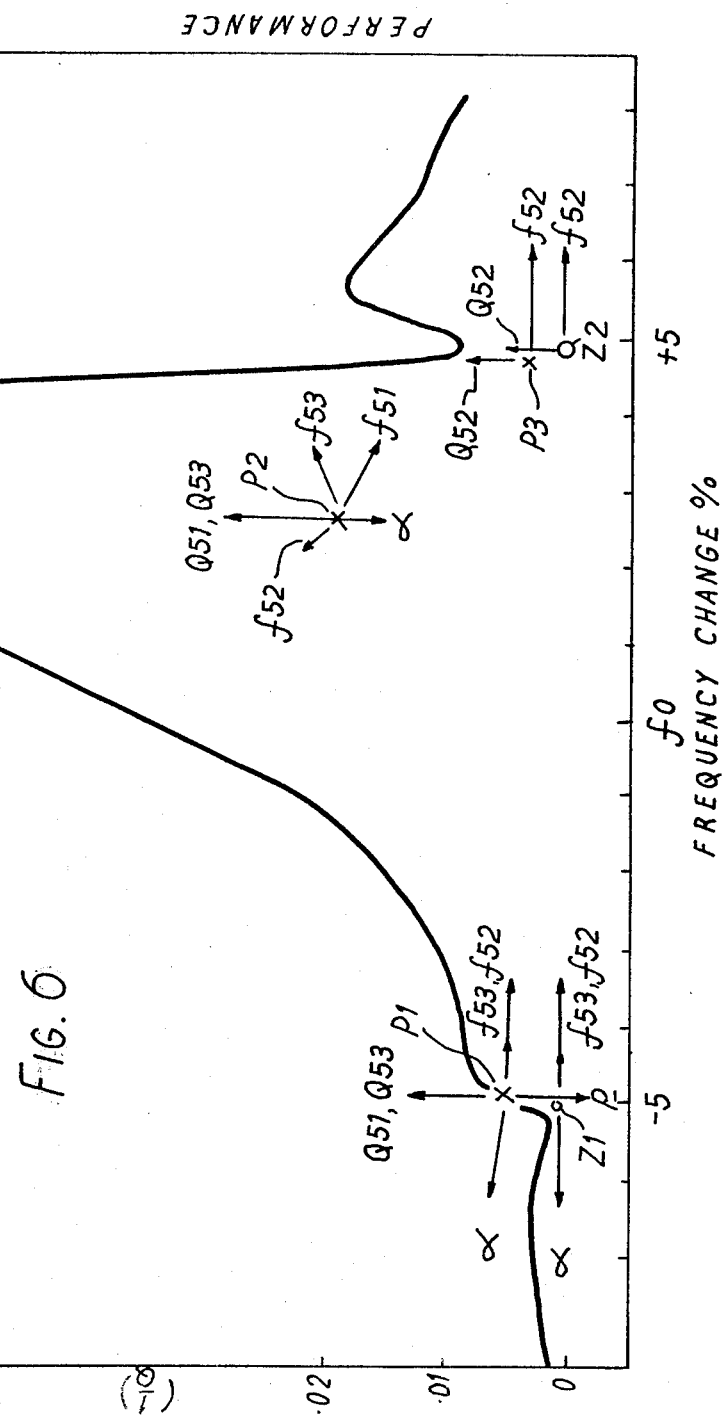

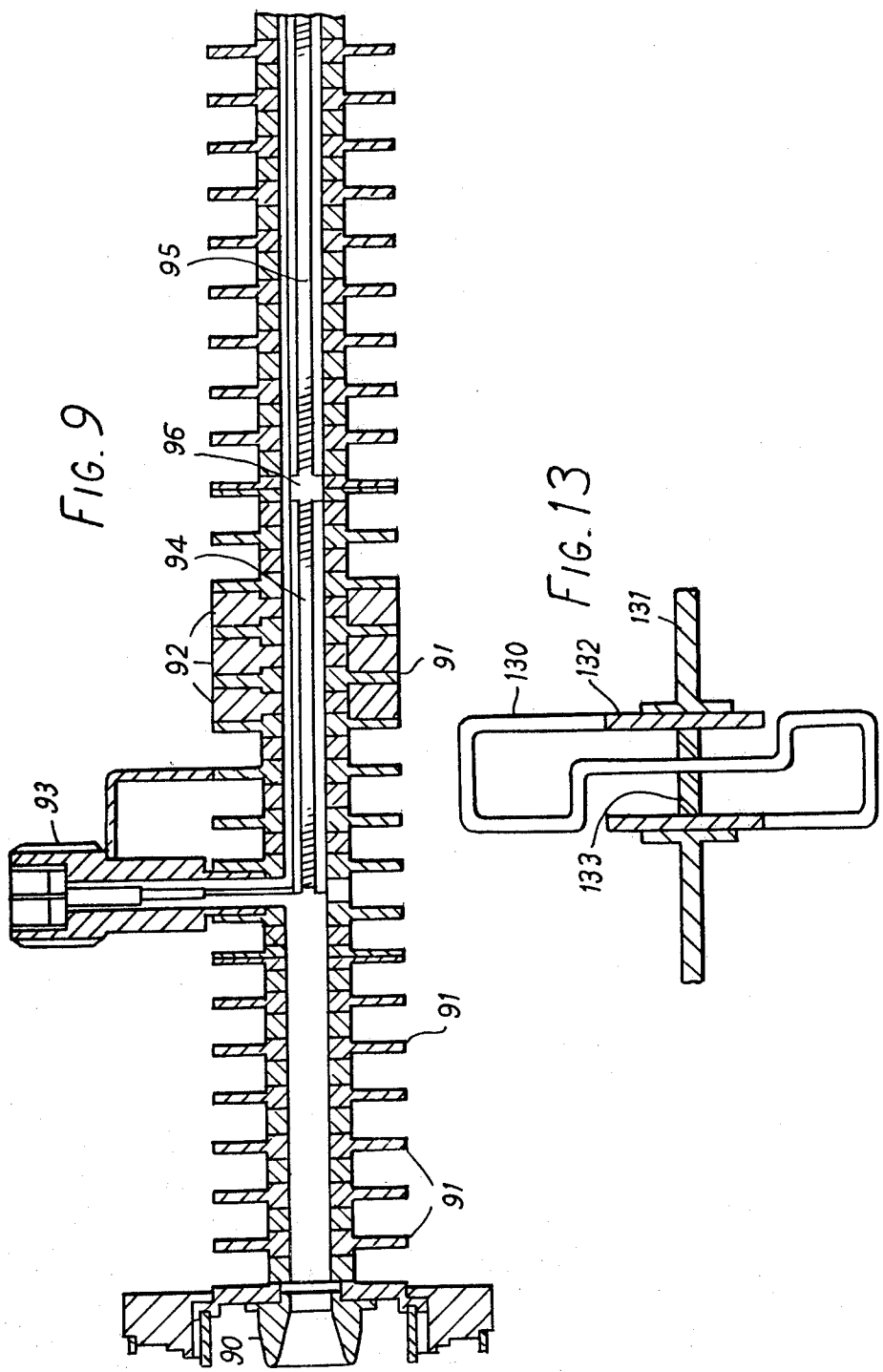

LINEAR BEAM MICROWAVE AMPLIFIER HAVING SECTION COMPRISING THREE RESONANT COUPLED CIRCUITS TWO OF WHICH ARE RESONANT CAVITIES WHICH INTERACT WITH THE BEAM

The present invention relates to microwave amplifiers, and in particular to linear beam tubes.

An example of a linear beam tube microwave amplifier is a conventional klystron. A conventional klystron comprises a number of cavities; buncher cavities, and an output cavity from which the amplified RF is extracted. Such a klystron has a small bandwidth efficiency product.

Various improvements on the conventional klystron have been made to increase bandwidth and/or efficiency. For instance an unconventional klystron, the so called "extended interaction klystron", has been developed, which is more efficient, and/or allows a higher bandwidth, than conventional types of klystron. An example of such a klystron is described in U.S. Pat. No. 3,375,397. That klystron has an extended interaction output section which comprises a plurality of cavity resonators all of which are coupled to the beam path, being successively arranged along the beam path. Each cavity resonator includes an interaction gap for interaction with the electron beam. Inductive coupling means communicate between adjacent cavity resonators to form an inductively coupled output cavity resonator structure. The inductive coupling means comprises elongated coupling slots communicating through a common wall between adjacent cavity resonators. The klystron may have an input section which is similar to the output section.

It is an object of the present invention to provide another microwave amplifier having an improved efficiency bandwidth product as compared to a conventional klystron.

According to one aspect of the invention, there is provided an output section for a microwave amplifier having a linear beam path, comprising:

a first resonant cavity defining a portion of the beam path and adapted to be coupled to a preceding section of the amplifier, the cavity being arranged to interact with the beam, a second resonant cavity defining a succeeding portion of the beam path, the cavity being arranged to interact with the beam and being coupled to the first cavity via the beam path, a third resonant cavity, first coupling means coupling the first and second cavities other than along the beam path but not coupling the third and first cavities, second coupling means coupling the third cavity to the second cavity but not coupling the third and first cavities, and third coupling means for coupling the third cavity to an output transmission line.

According to another aspect, there is provided a circuit for use in a microwave amplifier having a linear electron beam path, the circuit comprising a first resonant cavity arranged on the beam path to interact with the beam, a second resonant cavity arranged on the beam path to interact with the beam, the first and second cavities being directly coupled only via the beam path, a third resonant cavity, and first and second coupling means coupling the third cavity to the first and second cavities respectively, the third cavity being coupled to the beam only via the first and second cavities.

For a better understanding of the present invention, and to show how the same may be carried into effect, reference will now be made, by way of example, to the accompanying drawings, in which:

FIG. 1 is an axial section through one example of a klystron,

FIGS. 2a to c show in detail the output section of that klystron,

FIG. 3 is a graph of the variation of output impedance with frequency for that klystron, FIG. 4 is a pole-zero diagram.

Figure 10:
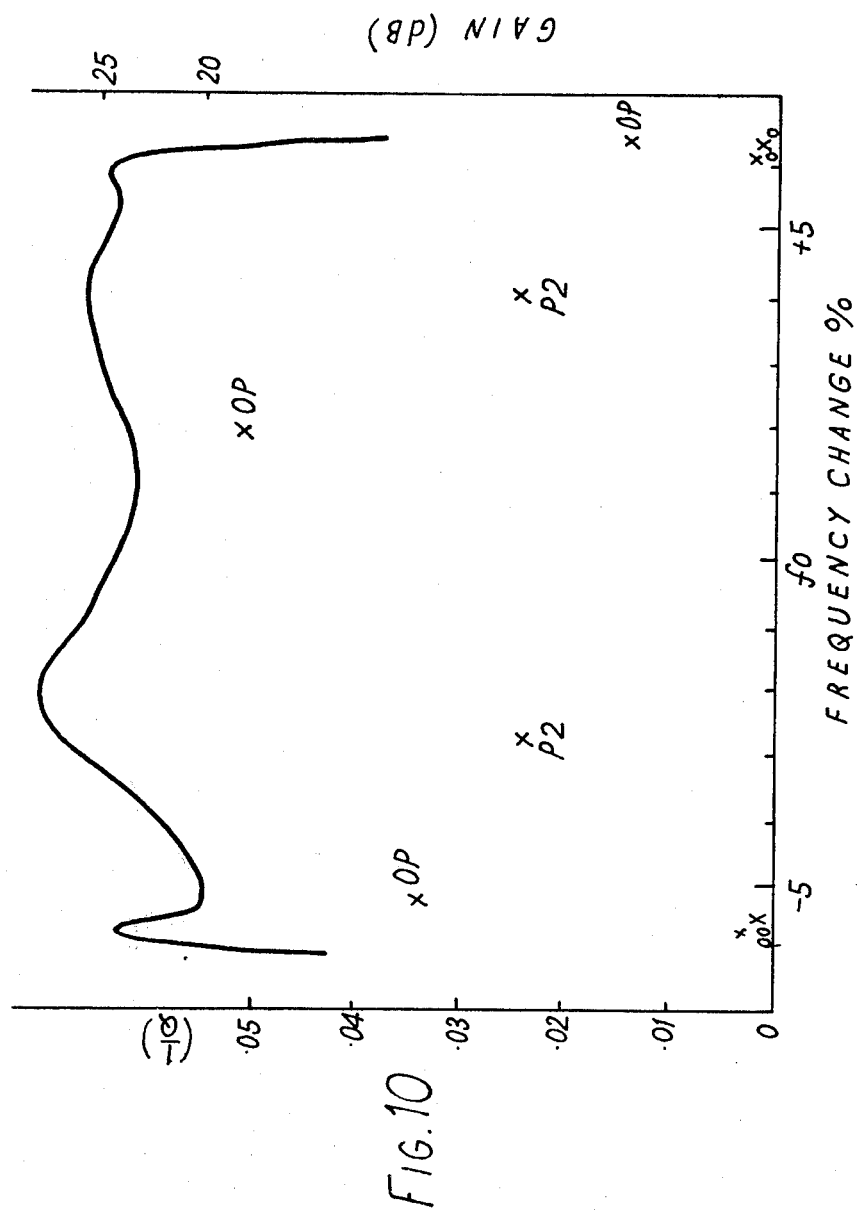
Figure 11:
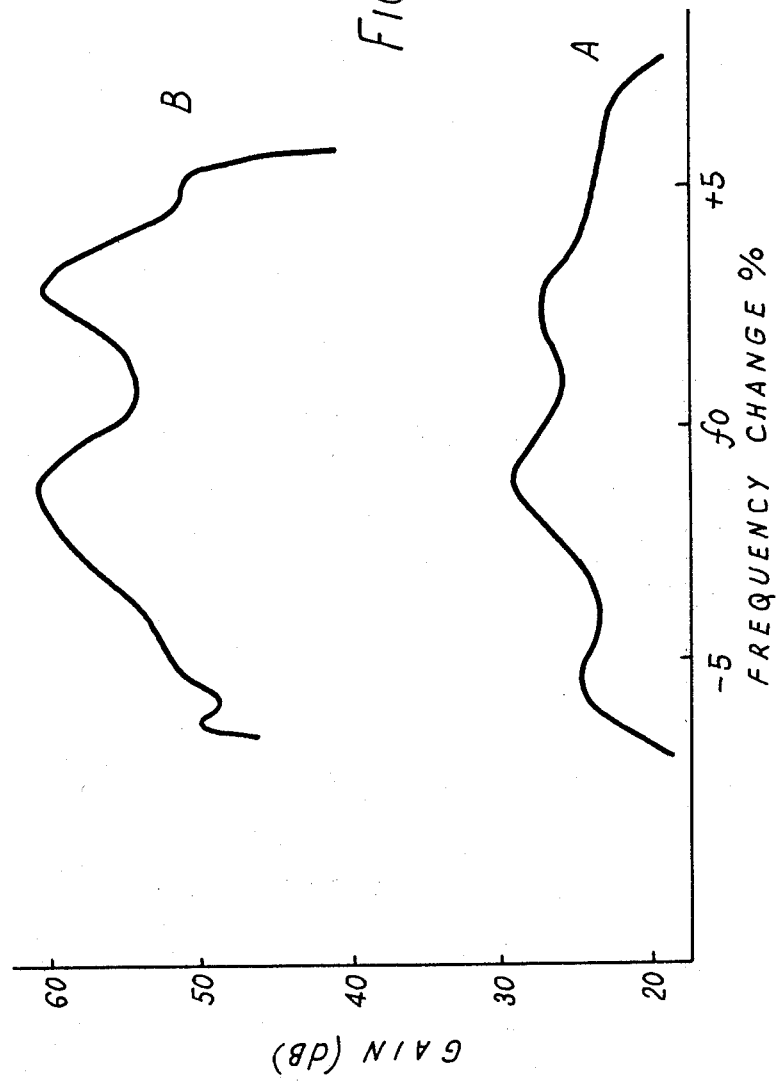
Figure 12:
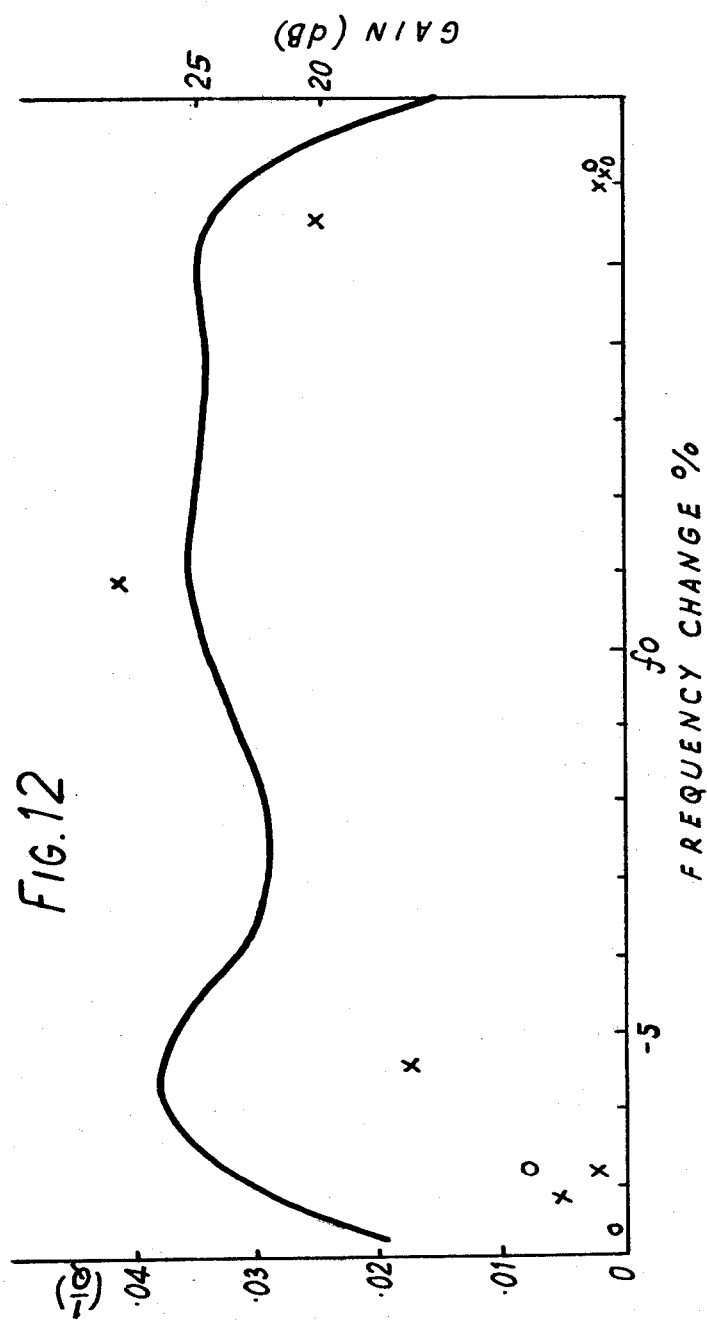

FIG. 5 is a schematic diagram of an axial section of a buffer or buncher circuit, FIG. 5A is a schematic radial section of the circuit of FIG. 5, FIG. 6 is a pole-zero diagram of the circuit of FIG. 5, FIGS. 7 and 8 are schematics of linear beam tubes, according to the invention FIG. 9 is an axial section of a portion of a travelling tube, FIG. 10 is a pole zero diagram of a combination of two circuits according to FIG. 5 and an output according to FIG. 2, FIG. 11 is a frequency response diagram for the whole tube of FIG. 7, FIG. 12 is a frequency response diagram for the input section of the tube of FIG. 8; and FIG. 13 shows a loop coupling.

Referring to FIG. 1, the klystron comprises an electron gun assembly 1 for producing an electron beam which is guided down a beam path 2 to a collector 3 where it is collected in known manner.

The electron gun assembly 1 comprises a cathode 4, a control grid 5, a cathode screen 6, and an anode 7.

The beam 2 passes through a succession of resonant cavities and drift tubes, which are in three operative sections, an input section 8, a buncher section 9 and an output section 10.

In this example, the input section 8 is conventional and comprises a single resonant cavity having an input 11 for R.F. to be amplified. The R.F. interacts with the electron beam in the cavity to modulate the velocity of the electrons in the beam. In this example, the buncher section 9 is conventional and comprises a plurality of cavities 12 which interact with the modulated beam to enhance the bunching, caused by the modulation, of the electrons. Tuning means, of which only one is shown diagrammatically at 17, are provided in the cavities 12, and also in cavity 8. These means are well known in the art and operate in the known manner. Water cooling is provided at 18 and 19, and reference 20 denotes a pinch for evacuating the klystron.

The output section 10 is shown in more detail in FIGS. 2a, 2b, and 2c where the reference numerals of FIG. 1 have been used. In accordance with this example of the invention, the output section 10 comprises 3 resonant coupled cavities C1, C2 and C3, of which two, that is C1 and C2, are coupled directly to the beam and are coupled together by a slot S in their common wall, and one, C3 is coupled to the last cavity C2 of the output section via an interior iris 13. Cavity C3 is not coupled to cavity C1. An output waveguide 14 is coupled to the third cavity C3 via an exterior iris 15. A tuning post 16 is provided in the third cavity C3. As shown in FIGS. 1 and 2a, the slot S is remote from the cavity C3, whereby cavity C3 is not coupled to cavity C1.

Reference numerals 20 and 21 in FIG. 2a denote interaction gaps in the cavities C1 and C2. The interaction gaps are the zones of interaction of the electron beam on paths 2 with the cavities.

The output section 10 is arranged to have, in operation, an output impedance versus frequency response as shown by curve 31 in FIG. 3, and be stable across the whole frequency band. The output section is defined by the following theoretical parameters for each cavity in isolation:

| Resonant frequency | f |
| Quality factor | Q |
| Ratio of shunt resistance R to Q | R/Q (for cavities C1 and C2 but not C3) |
| values of coupling between C1 and C2; and between C2 and C3: | $\alpha$ |
| | $\alpha$ out |
| pitch, i.e. distance between the centres of the gaps 20 and 21 along the beam path 2: | $p$ |
| Q external, i.e. the external loading of cavity C3 | Q ext. |

Other factors affecting the operation are the beam voltage, the perveance of the beam and the mid-band frequency.

The resonant frequency f of the cavity C3 may be adjusted by the tuning post 16 in known manner. The resonant frequency f of the cavity C1 and of the cavity C2 may be determined by the size of the cavity or by adjusting the gap length, or by means of a mechanical tuner. The value of coupling $\alpha$ between the cavities C1 and C2 is determined by the size of the slot S in their common wall. The value of coupling $\alpha$ between the cavities C2 and C3 is determined by the interior iris 13. The value of the external load Q ext on the cavity C3 is determined by the exterior iris 15.

The output section must be stable over the desired frequency band. It has been shown that the gain of a klystron has the form $$G(s) = K(s) \frac{(Z_1 - s)(Z_2 - s)\ldots(Z_{n-1} - s)}{(P_1 - s)(P_2 - s)\ldots(P_n - s)}$$

The roots $Z_i = s$ are called zeros and the roots $P_i = s$ are called poles.

The pole $$P_i = \frac{\omega_i}{2Q_i} + j\Omega_i$$

where $\omega_i$ is angular frequency and $$\Omega_i = \sqrt{1 - 1/(2Q_i)^2}$$

if $\omega_i/2Q_i$ is positive, the pole $P_i$ represents an oscillatory response to a unit impulse which response decays exponentially and thus is stable. (Zeros do not affect stability, but do affect the magnitude of the gain G(s). The values of the parameters of the output section are chosen to produce a stable klystron, i.e., one in which $\omega_i/2Q_i$ is positive for the poles $P_i$.

FIG. 4 is a pole zero diagram showing how the positions of the poles P and zeros Z of a specific example of the output section of FIG. 2 vary with the parameters and pitch. The three cavity output section has three poles P1, P2 and P3 and two zeros Z1 and Z2. It is apparent that all the poles are positive and thus stable. Both the zeros are positioned above the high frequency end of the frequency band and so the response has three humps.

By choosing the values of the parameters set out in the following table, the stable frequency response shown in curve 31 of FIG. 3 is obtained:

| | C1 | C2 | C3 |
|---|---|---|---|
| f | 3065 | 3100 | 3060 MHz |
| R/Q | 120 | 120 | — |
| Q | 500–1000 | 500–1000 | 500–1000 |
| $\alpha$ | 0.063 | 0.100 | |
| Qext | | | 13 |
| pitch | 25.0mm | | |
| mid-band frequency | | 2950 MHz | |
| beam voltage | | 76 KV | |
| perveance | | 2$\mu$perv. | |

Curve 32 shows, for the purpose of comparison, the corresponding response of an example of a$\pi$ and 2$\pi$ overlapping mode, extended interaction output (EIO) klystron. Such a klystron has an extended interaction output section which has two cavities coupled to the beam and to each other. The section has two modes of resonance: at one resonant frequency the voltages in the interaction gaps of the cavities are in phase—this is known as the zero or two pi-mode; at the other resonant frequency the gap voltages are in antiphase—this is known as the pi-mode. The cavity parameters are chosen so that the response of both modes overlap in the middle of the band. In the example, the pitch between the gaps is chosen so that the klystron is stable over the whole band.

Comparison of the curves 31 and 32 shows that the output section 10 of the specific example of the present invention described hereinbefore has a greater bandwidth with slightly less minimum impedance than the overlapping mode EIO klystron. The bandwidth is about 14% and the efficiency is about 27% or more giving a bandwidth/efficiency product of 378.

The specific example is comfortably stable. If the stability margin were to be reduced, a greater bandwidth could be achieved but with less efficiency in the middle of the band.

The bandwidth of the output section 10 is greater than that of the conventional buncher section 8. In order to use the available bandwidth, the conventional buncher section 9 would have to be tuned for one portion of the bandwidth when amplifying signals falling within that portion of bandwidth and retuned to use the other portion. This may be done in known manner.

However, by using a circuit as shown in FIG. 5 to form buffer or buncher sections as shown in FIG. 7 or FIG. 8, more of the available bandwidth of the output section 10 is usable without the need for retuning.

Referring to FIG. 5, there is shown a circuit which may be used as part of a buncher section. The circuit comprises two separate resonant cavities C52, C51 which include interaction gaps and so are directly coupled to the beam and a third resonant cavity C53 indirectly coupled to the beam. Reference numerals 57 and 58 denote interaction gaps in the cavities C51 and C52.

The third cavity C53 is coupled to the cavities C50 and 51 via coupling slots 53 and 54 in the common walls between it and the cavities C52 and C51. It includes two tuning posts 55 and 56. As shown schematically in FIG. 5A, cavities C52 and C51 are circular in cross-section whilst cavity C53 is part circular. Cavity 53 could be an annulus coaxial with the cavity C50 and C51.

The pole-zero diagram for the circuit of FIG. 5 is shown in FIG. 6.

The circuit is defined by the following theoretical parameters for each cavity in isolation:

| | |
|---|---|
| Resonant frequency | f |
| Quality factor | Q |
| Ratio of shunt resistance R to Q | Rsh/Q |
| values of coupling between the cavities | α |
| pitch, i.e. distance between the centres of the gaps 57 and 58 | p |
| Loading of the cavities | |

In the following the parameters f, Q etc. are assigned subscripts 51, 52 and 53 denoting the cavities C51, C52 and C53 to which they belong.

The parameters are chosen to position the poles and zeros to give stable operation of a desired bandwidth about a centre frequency fo.

The resonant frequency f53 of the cavity C53 may be adjusted by the tuning posts 55 and 56 in known manner. The resonant frequency f52 or f51 of the cavity C52 or C51 may be adjusted by adjusting the size of the cavity or the length of the gap 57 or 58 or by means of a mechanical tuner (if provided). The values of coupling α between the cavities C51 and C53 and between C52 and C53 is determined by the size of the slots 53 and 54 therebetween. The loading of the cavities is determined by coating the walls of the cavities with a resistive coating e.g. of Kanthal (Registered Trade Mark) as is known in the art. The electron beam also loads the cavities.

Because cavity C53 is a resonant cavity both the magnitude and the phase of the coupling it provides between cavities C51 and C52 varies with frequency.

The poles and zeros of the circuit of FIG. 5 are arranged as shown in FIG. 6 where the ordinate 1/Q refers to the poles and zeros and the ordinate performance (i.e. gain) refers to the frequency responses shown by the continuous curve. There are three poles P1, P2, P3 denoted by X in the band with the low 'Q' pole P2 in the middle. Two zeros 21, 22 denoted by 0 are on the outside of the high 'Q' poles placed P3 and control their effect. The poles and zeros can be moved in the directions indicated by the arrows by varying the parameters associated with the arrows. For instance, the low 'Q' pole P2 can be moved across the full band without greatly affecting the other poles and zeros by varying α, p, Q1, Q3, F1, F2, F3 as indicated by the arrows. The bandwidth, which is effectively the separation of the high 'Q' poles, is limited only by the maximum coupling α which can be achieved. The high frequency pole P3 is not affected by the pitch P and does not need to be considered when assessing the stability margin.

The circuit responds well to loading and the 'Q' of all the poles can be reduced by loading the appropriate cavities.

This is a well behaved circuit with adequate stability margin. It has a well defined band with three poles in the band. It does not make a suitable buffer section on its own due to the gain variation in the band. However with an extra pole in the band it makes a good buffer section. It is used as a buffer section in combination with other circuits as described hereinafter with reference to FIG. 8 or FIG. 7.

Referring to FIG. 7, a complete linear beam tube comprises an input section which is formed of a conventional travelling-wave-tube section (TWT section), 62 which is followed by buffer sections 61', followed by an output section 60.

The output section is a high power section, having a high bandwidth/efficiency product and is as shown in, and described with reference to FIGS. 2a, 2b and 2c.

The input or TWT section 62 bunches the electron beam according to an RF input applied to it and provides gain.

The buffer section 6, which comprises two circuits each of which is as shown in and described with reference to FIGS. 5 and 6, also produces bunching but, more importantly electrically, provides gain and buffers the high power output section where no loading can be used from the low power input section where loading can be used, without itself substantially loading the beam, so that the input section can operate in the small signal mode whilst the output section can operate in the large signal mode. The TWT section 62 is entirely conventional and is chosen so that its gain/bandwidth characteristics match these of the output section.

An example of a TWT section is shown in FIG. 9. The sections shown is entirely conventional and comprises and electron gun of which only the focussing electrode 90 is shown, which supplies an electron beam to an evacuated tube. The tube is defined by a plurality of magnetic pole-pieces 91. The spaces between the pole-pieces house magnets 92 (only three shown) which focus the beam along the tube.

A coaxial input 93 is provided for applying an RF signal to be amplified to a helix in the tube. The helix is divided, in known manner, into a plurality of sections 94, 95 with a sever load 96 between them.

FIG. 9 shows only part of the TWT. At least one more helix section may be provided, and the electron beam collecter is provided not in the TWT section, but in the output section 60 of the linear beam tube.

The helix may be replaced by some other slow wave structure such as a ring-bar, coupled cavity, or ring loop structure. The structure is chosen to give the characteristic appropriate to the desired gain/bandwidth and power characteristics as is known in the art.

In a preferred embodiment of the tube of FIG. 7, the TWT section comprises a VTS5753 tube which is produced by Varian Associates Inc. of Palo Alto, Calif. Such a section has a frequency response similar to that shown in FIG. 11A.

The buffer sections 61 each comprise a circuit as shown in FIG. 5. The circuits are designed to have complementary frequency responses so as to give a smoother frequency response than a single such circuit. This is achieved in part by offsetting the poles P2 of the two circuits so they occur at different frequencies. When combined with the output section of FIGS. 2a, 2b, and 2c the buffers and output section have for example a frequency response as shown in FIG. 10.

In that Figure P2 indicates the offset poles P2 of the two circuits 61 and OP indicates the poles introduced by the output section.

The frequency response of the whole tube is similar to that shown in FIG. 11b.

The following table sets out the essential design parameters for the preferred embodiment of the tube of FIG. 7.

TWT section—VTS5753—Varian Associates Inc.
Buffer sections:

|  | f | Q | −Rsh/Q | α | p |
|---|---|---|---|---|---|
| No. 61 |  |  |  |  |  |
| cavity C51 | 3220 | 1000 | 120 | .12 | 17mm |
| cavity C52 | 3550 | 1000 | 120 | .12 |  |
| cavity C53 | 3220 | 1000 | — |  |  |
| No. 61[1] |  |  |  |  |  |
| cavity C51 | 3470 | 1000 | 120 | .2 | 17mm |
| Cavity C52 | 3530 | 1000 | 120 | .2 |  |
| Cavity C53 | 3470 | 1000 | — |  |  |
| Output Section: |  |  |  |  |  |
| cavity C1 | 3510 | 1000 | 120 | .063 | 17mm |
| cavity C2 | 3550 | 1000 | 120 | .1 |  |
| cavity C3 | 3505 | 13 | — |  |  |

Another linear beam tube is shown in FIG. 8. It comprises an input section which comprises a conventional Klystron input cavity 80 followed by two buncher sections 81 and 82 each of which is as shown in FIG. 5. The following buffer sections 9 and output section 60 are identical to those of FIG. 7.

The buncher sections 81 and 82 are designed in much the same way as the buffer sections 61 to produce a smooth frequency response by offsetting the poles P2. In addition, because the buncher sections operate a low power, they may be loaded to reduce ripple in the frequency response. When combined with the input cavity, they produce the frequency response shown in FIG. 12.

The essential design parameters for the cavity 80 and the buncher sections 81 to 82 are as set out in the following table for a preferred embodiment.

|  | f | Q | −Rsh/Q | α |
|---|---|---|---|---|
| Cavity 80 | 3470 | 40 | 120 |  |
| Buncher 81 |  |  |  |  |
| cavity C51 | 3210 | 50 | 120 | .1 |
| Cavity C52 | 3575 | 50 | 120 | .1 |
| Cavity C53 | 3210 | 1000 | — |  |
| Buncher 82 |  |  |  |  |
| cavity C51 | 3400 | 50 | 120 | .18 |
| cavity C52 | 3580 | 50 | 120 | .18 |
| cavity C53 | 3400 | 1000 | — |  |

In the foregoing, coupled resonant cavities have been shown coupled by slots in the common walls. The slots, however, may be replaced by a loop coupling as is known in the art. FIG. 13 shows such a loop coupling in a common wall 131 between two cavities. A tubular sleeve 132 is placed in a circular opening in the wall 131. Within the sleeve 132 is an electrically insulative panel 133 if a vacuum seal is required. A conductor 130 is connected at one end to the sleeve in one cavity and at the other end to the sleeve in the other cavity, the conductor passing through the panel 133.

What we claim is:

1. An output section for a microwave amplifier for operating with a predetermined mid-band frequency and having a linear electron beam path for a beam of predetermined velocity in the output section comprising:

a first resonant cavity defining a portion of the beam path and adapted to be coupled to a preceding section of the amplifier only via the beam, the cavity being arranged to interact with the beam, a second resonant cavity defining a succeeding portion of the beam path and adapted to be coupled to a succeeding section of the amplifier only via the beam, the cavity being arranged to interact with the beam, the section having no other resonant cavities defining portions of the beam path, a third resonant cavity, the cavities being dimensioned for stable operation of the output section and having coupling means adapted to facilitate the said stable operation, the coupling means comprising a first coupling coupling the first and second cavities other than along the beam path but not coupling the third and first cavities, a second coupling coupling the third cavity to the second cavity but not coupling the third and first cavities, and a third coupling for coupling the third cavity to an output transmission line.

2. A microwave amplifier for operating with a predetermined mid band frequency and having a linear electron beam path for a beam of predetermined beam voltage and perveance and comprising: an outut section defining a portion of the linear beam path; an electron gun assembly; a further section, including at least an input section, defining the portion of the path between the output section and the gun assembly; and a collector; wherein the output section comprises a first resonant cavity defining a portion of the beam path and coupled to the further section only via the beam path, the cavity being arranged to interact with beam, a second resonant cavity defining a successive portion of the beam path and sharing a common wall with the first cavity, the second cavity being arranged to interact with the beam, the collector being coupled to the second cavity only via the beam path, the output section having no other resonant cavities forming portions of the beam path, and a third resonant cavity which is arranged to not interact with the beam, stable operation of the output section being provided by the dimensions of the cavities and by first coupling means coupling the first and second cavities other than along the beam path, but not coupling the first and third cavities, second coupling means coupling the third and second cavities, but not coupling the third and first cavities to an output transmission line, and third coupling means for coupling the third cavity to an output transmission line.

3. An amplifier according to claim 2, wherein the first coupling means comprises a slot.

4. An amplifier according to claim 2 wherein the second coupling means comprises an iris.

5. An amplifier according to claim 2, further comprising an output transmission line in the form of a waveguide coupled to the third cavity.

6. An amplifier according to claim 5, wherein the third coupling means comprises an iris.

7. An amplifier according to claim 2, wherein at least one of the coupling means is in the form of a loop coupling.

8. An amplifier according to claim 2 wherein the further section comprises the input section and an intermediate section between the input section and the output section.

9. An amplifier according to claim 8, wherein the intermediate section comprises at least one circuit comprising
a first resonant cavity arranged on the beam path to interact with the beam,
a second resonant cavity arranged on the beam path to interact with the beam,
the first and second cavities being directly coupled to each other and to adjacent sections of the amplifier only via the beam path,
a third resonant cavity arranged to not interact with the beam, and
stable operation of the circuit being provided by the dimensions of the cavities and by
first and second coupling means coupling the third cavity only to the first and second cavities respectively.

10. An amplifier according to claim 9 wherein the intermediate section comprises a series arrangement of two of the said circuits.

11. An amplifier according to claim 9 wherein each coupling means of the circuit comprises a slot in a common wall between the cavities coupled by that coupling means.

12. An amplifier according to claim 9, wherein the input section comprises a travelling wave tube section.

13. An amplifier according to claim 2, wherein the input section includes a standard klystron cavity.

14. An amplifier according to claim 13, wherein the input section includes the series arrangement of said klystron cavity and a circuit comprising
a first resonant cavity arranged on the beam path to interact with the beam, being coupled to the said klystron cavity only via the beam path
a second resonant cavity arranged on the beam path to interact with the beam, being coupled to the said first cavity and to any succeeding cavity of the amplifier
only via the beam path,
a third resonant cavity arranged to not interact with the beam, and
first and second coupling means coupling the third cavity to the first and second cavities respectively.

15. A circuit for use in a microwave amplifier for operating with a predetermined mid band frequency having a linear electron beam path for a beam of predetermined beam voltage and perveance, the circuit comprising
a first resonant cavity for defining a portion of the beam path and adapted to interact with the beam,
a second resonant cavity for defining a successive portion of the beam path and adapted to interact with the beam
the first and second cavities being directly coupled together only via the beam path and being adapted to be coupled to preceeding and succeeding sections of the amplifier only via the beam,
a third resonant cavity which is arranged to not interact with the beam, and
stable operation of the circuit being provided by the dimensions of the cavities and by
first and second coupling means coupling the third cavity only to the first and second cavities respectively.

16. A microwave amplifier for operating with a predetermined mid-band frequency, having a linear electron beam path for a beam of predetermined beam voltage and perveance, and comprising:
an output section defining a portion of the beam path;
an electron gun assembly;
a further section including at least an input section, defining the portion of the path between the gun assembly and the output section; and
a collector; wherein the output section comprises
first and second resonant cavities arranged to interact with the beam, the first cavity being coupled to the further section only via the beam path and the second cavity being coupled to the collector only via the beam path the output section having no other resonant cavities arranged to interact with the beam, and
at least one resonant circuit arranged to not interact with the beam,
stable operation of the output section being provided by the dimensions of the first and second cavities and of the resonant circuit and by
first coupling means coupling the first and second cavities other than along the beam path, but not coupling the first cavity to the resonant circuit,
second coupling means coupling the second resonant cavity to the resonant circuit but not coupling the resonant circuit to the first cavity, and
third coupling means for coupling the resonant circuit to an output transmission line.

17. An output section according to claim 1, wherein the first, second and third couplings are dimensioned to provide high values of coupling and a low value of Q ext and the section has three positive poles within the said band with two zeroes at respective ends of the band being outside thereof.

18. An output section according to claim 17, wherein the said value of Q ext is about 13, the value of coupling provided by the second coupling is about 0.1 and the value of coupling provided by the first coupling is about 0.06.

19. An amplifier according to claim 2, wherein the first, second and third couplings are dimensioned to provide high values of coupling and a low value of Q ext and the section has three positive poles within the said band with two zeroes at respective ends of the band being outside thereof.

20. An amplifier according to claim 19, wherein the said value of Q ext is about 13, the value of coupling provided by the second coupling is about 0.1 and the value of coupling provided by the first coupling is about 0.06.

21. An amplifier according to claim 16, wherein the first second and third couplings are dimensioned to provide high values of coupling and a low value of Q ext and the section has three positive poles within the said band with two zeroes at respective ends of the band being outside thereof.

22. An amplifier according to claim 21, wherein the said value of Q ext is about 13, the value of coupling provided by the second coupling is about 0.1 and the value of coupling provided by the first coupling is about 0.06.

23. A circuit according to claim 15, wherein the circuit has three poles with the said band and two zeroes at respective ends of the band placed just outside thereof.

24. An amplifier according to claim 19, wherein the circuit has three poles with the said band and two zeroes at respective ends of the band placed just outside thereof.

25. A section for use in a microwave amplifier for operating with a predetermined mid-band frequency having a linear electron beam path for a beam of predetermined beam voltage and perveance, the circuit comprising
- a first resonant cavity for defining a portion of the beam path and adapted to interact with the beam,
- a second resonant cavity for defining a succeeding portion of the beam path and adapted to interact with the beam,
- the first and second cavities being directly coupled only via the beam path and being adapted to be coupled to preceding and succeeding sections of the amplifier only via the beam,
- a resonant circuit which is arranged to not interact with the beam,
- stable operation of the section over a band of preset bandwidth being provided by the dimensions of the cavities and of the resonant circuit and by first and second coupling means coupling the resonant circuit only to the first and second cavities.

26. An output section according to claim 1, wherein the first and second cavities are re-entrant klystron cavities defining a drift tube for the portion of the beam path extending between the cavities.

27. An amplifier according to claim 2, wherein the first and second cavities are re-entrant klystron cavities defining a drift tube for the portion of the beam path extending between the cavities.

28. An amplifier according to claim 9, wherein the first and second cavities of the said circuit are re-entrant klystron cavities defining a drift tube for the portion of the beam path between these cavities.

29. A circuit according to claim 15, wherein the first and second cavities are re-entrant klystron cavities defining a drift tube for the portion of the beam path extending between the cavities.

30. An amplifier according to claim 16, wherein the first and second cavities are re-entrant klystron cavities defining a drift tube for the portion of the beam path extending between the cavities.

* * * * *